US009078381B2

(12) United States Patent
You

(10) Patent No.: US 9,078,381 B2
(45) Date of Patent: Jul. 7, 2015

(54) METHOD OF CONNECTING TO A MONOLITHIC VOLTAGE REGULATOR

(71) Applicant: Silergy Technology, Sunnyvale, CA (US)

(72) Inventor: Budong You, Hangzhou (CN)

(73) Assignees: Silergy Technology, Sunnyvale, CA (US); Silergy Semiconductor Technology (Hangzhou) LTD, Hangzhou (CN)

(*) Notice: Subject to any disclaimer, the term of this patent is extended or adjusted under 35 U.S.C. 154(b) by 378 days.

(21) Appl. No.: 13/740,405

(22) Filed: Jan. 14, 2013

(65) Prior Publication Data

US 2013/0125393 A1    May 23, 2013

Related U.S. Application Data

(63) Continuation of application No. 12/462,839, filed on Aug. 10, 2009, now Pat. No. 8,400,784.

(51) Int. Cl.
*H05K 3/30* (2006.01)
*H05K 3/34* (2006.01)
*H01L 23/495* (2006.01)
(Continued)

(52) U.S. Cl.
CPC ........... *H05K 3/341* (2013.01); *Y10T 29/49144* (2015.01); *H01L 23/3107* (2013.01); *H01L 23/49548* (2013.01); *H01L 23/49562* (2013.01); *H01L 23/49572* (2013.01); *H01L 24/16* (2013.01); *H01L 2224/16245* (2013.01); *H01L 2924/01079* (2013.01); *H01L 2924/14* (2013.01); *H01L 2924/19041* (2013.01); *H01L 2924/19042* (2013.01); *H01L 2924/10253* (2013.01); *H01L 24/17* (2013.01)

(58) Field of Classification Search
CPC ............ H01L 23/49575; H01L 23/495; H01L 23/4951; H01L 24/11; H01L 23/49861; H01L 2224/16112; H01L 2224/81193; H01L 2224/73253; H01L 2225/1058; H01L 24/03; H01L 31/048; Y10T 29/49144; Y10T 29/5317
USPC .................. 29/841, 825, 829, 831, 840, 846; 257/666, 676, 678, 690, E23.033, 257/E23.039, E23.124; 361/775, 780, 813
See application file for complete search history.

(56) References Cited

U.S. PATENT DOCUMENTS 6,278,264 B1    8/2001  Burstein et al.
7,045,883 B1*   5/2006  McCann et al. .............. 257/673
7,112,871 B2*   9/2006  Shiu et al.
(Continued)

*Primary Examiner* — Thiem Phan
(74) *Attorney, Agent, or Firm* — Michael C. Stephens, Jr.

(57) ABSTRACT

Methods and apparatuses related to packaging a monolithic voltage regulator are disclosed. In one embodiment, an apparatus includes: (i) a monolithic voltage regulator with a transistor arranged as parallel transistor devices; (ii) bumps on the monolithic voltage regulator to form connections to source and drain terminals of the transistor; (iii) a single layer lead frame with a plurality of interleaving lead fingers coupled to the monolithic voltage regulator via the bumps, where the single layer lead frame includes first and second surfaces, where the first surface includes a first pattern to form connections to the bumps, and where the second surface includes a second pattern that is different from the first pattern; and (iv) a flip-chip package encapsulating the monolithic voltage regulator, the bumps, and the single layer lead frame, where the flip-chip package has external connectors of the monolithic voltage regulator at the second surface of the single layer lead frame.

19 Claims, 13 Drawing Sheets

(51) Int. Cl.
*H01L 23/31* (2006.01)
*H01L 23/00* (2006.01)

(56) References Cited

U.S. PATENT DOCUMENTS

| | | |
|---|---|---|
| 8,085,553 B1 | 12/2011 | Lacap et al. |
| 2005/0003677 A1 | 1/2005 | Dean et al. |
| 2005/0179108 A1 | 8/2005 | Hossain et al. |
| 2008/0035959 A1 | 2/2008 | Jiang |
| 2008/0048218 A1 | 2/2008 | Jiang |
| 2008/0111219 A1 | 5/2008 | Harnden et al. |
| 2008/0296690 A1 | 12/2008 | Anderson et al. |
| 2008/0299705 A1 | 12/2008 | Lee |

* cited by examiner

METHOD OF CONNECTING TO A MONOLITHIC VOLTAGE REGULATOR

CROSS REFERENCES TO RELATED APPLICATIONS

This application is a continuation of the following application, U.S. patent application Ser. No. 12/462,839, entitled "FLIP CHIP PACKAGE FOR MONOLITHIC SWITCHING REGULATOR," filed on Aug. 10, 2009, and which is hereby incorporated by reference as if it is set forth in full in this specification.

FIELD OF THE INVENTION

The present invention generally relates to the field of semiconductor devices. More specifically, embodiments of the present invention pertain to packaging of monolithic regulators.

BACKGROUND

Voltage regulators, such as DC-to-DC voltage converters, are used to provide stable voltage sources for various electronic systems. Efficient DC-to-DC converters are particularly needed for battery management in low power devices (e.g., laptop notebooks, cellular phones, etc.). A switching voltage regulator generates an output voltage by converting an input DC voltage into a high frequency voltage, and then filtering the high frequency input voltage to generate the output DC voltage. Specifically, the switching regulator includes a switch for alternately coupling and decoupling an input DC voltage source (e.g., a battery) to a load (e.g., an integrated circuit (IC)). An output filter, typically including an inductor and a capacitor, may be coupled between the input voltage source and the load to filter the output of the switch, and thus provide the output DC voltage. A controller (e.g., a pulse width modulator, a pulse frequency modulator, etc.) can control the switch to maintain a substantially constant output DC voltage.

Monolithic switching regulators integrate controllers, drivers, and power devices into a same IC. Such monolithic regulators may have reduced resistance and inductance between components due to substantial elimination of wire connections between controller, driver, and power device components. This low resistance and inductance between the functional components allows monolithic switching regulators to carry a higher current density, and to operate at higher switching frequencies, as compared to discrete solutions.

SUMMARY

Embodiments of the present invention relate to methods of making and using, as well as structures, devices, and/or applications for packaging of a monolithic voltage regulator.

In one embodiment, an apparatus includes: (i) a monolithic voltage regulator with a transistor arranged as parallel transistor devices; (ii) bumps on the monolithic voltage regulator to form or complete connections to source and drain terminals of the transistor; (iii) a single layer lead frame with interleaving lead fingers coupled to the monolithic voltage regulator via the bumps, where the single layer lead frame includes first and second surfaces, where the first surface includes a first pattern to form connections to the bumps, and where the second surface includes a second pattern that is different from the first pattern; and (iv) a flip-chip package encapsulating the monolithic voltage regulator, the bumps, and the single layer lead frame, where the flip-chip package has external connectors of the monolithic voltage regulator at the second surface of the single layer lead frame.

In another embodiment, a method of connecting to a monolithic voltage regulator, includes: (i) using bumps on the monolithic voltage regulator to form or complete connections to source and drain terminals of a transistor of the monolithic voltage regulator; (ii) using a first surface of a single layer lead frame with interleaving lead fingers to connect to the monolithic voltage regulator via the bumps, where the first surface has a first pattern, and where the single layer lead frame includes the first surface and a second surface; (iii) using a flip-chip package to encapsulate the monolithic voltage regulator, the bumps, and the single layer lead frame; and (iv) using the second surface of the single layer lead frame to provide external connections to the monolithic voltage regulator at the flip-chip package, where the second surface includes a second pattern that is different from the first pattern.

Embodiments of the present invention can advantageously provide a packaging solution optimized for monolithic voltage regulators. Other advantages of the present invention will become readily apparent from the detailed description of preferred embodiments below.

DETAILED DESCRIPTION

Figure 1:
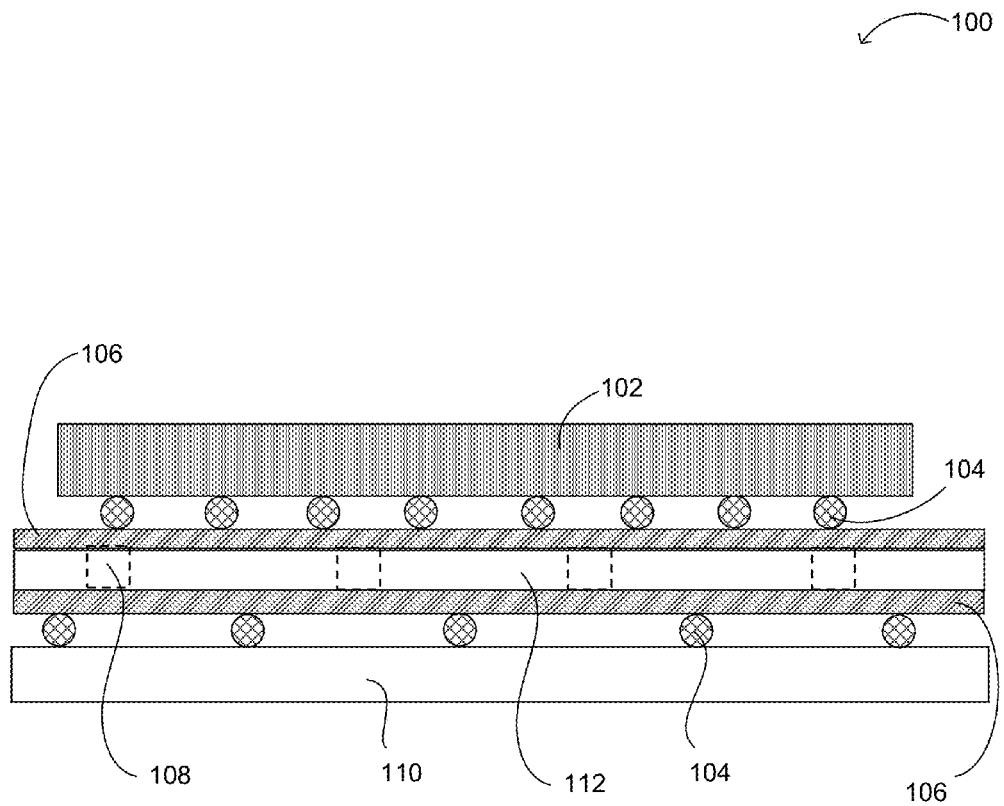
FIG. 1 is a cross-section diagram of an example flip-chip switching regulator.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Switching regulators typically include a large number of inputs/outputs (I/Os), including power I/Os, but contain many replicated function pins. Power transistors may also be arranged in a distributed fashion by using multiple smaller transistor devices connected in parallel, and a lead frame in particular embodiments can provide at least a part of such parallelized connections. The invention further relates to hardware implementations of the present structure, method and circuit. Embodiments of the present invention can advantageously provide a flip-chip package that is tailored for monolithic switching regulators. The invention, in its various aspects, will be explained in greater detail below with regard to exemplary embodiments.

While monolithic integration substantially reduces or eliminates large wire connections within on-chip functional components, switching regulators can also be mounted on a printed-circuit board (PCB) for interface and connection with other parts in an electronic system. Further, power can be transferred in and out of such a switching regulator. In particular embodiments, a monolithic regulator package can accommodate relatively low connection resistances and inductances on associated power signals such that that power can be transferred in and out of the regulator without wasting energy and creating excess heat on package connections.

Referring now to FIG. 1, shown is a cross-section diagram 100 of an example flip-chip switching regulator. In this example, silicon chip 102 is mounted on substrate 112, which is mounted to system PCB 110. This example includes two layers of lead frames 106 on either side of substrate 112 to conduct the current from silicon 102 by way of bumps or bumping balls 104 and vias 108 to system PCB 110. Drawbacks of this approach include having two layers of lead frames and bumping balls, which increases overall resistance and assembly complexity. In addition, the overall package thickness is increased due to the thickness of substrate 112, making this approach fairly unattractive for applications requiring a thin profile package.

Figure 2:
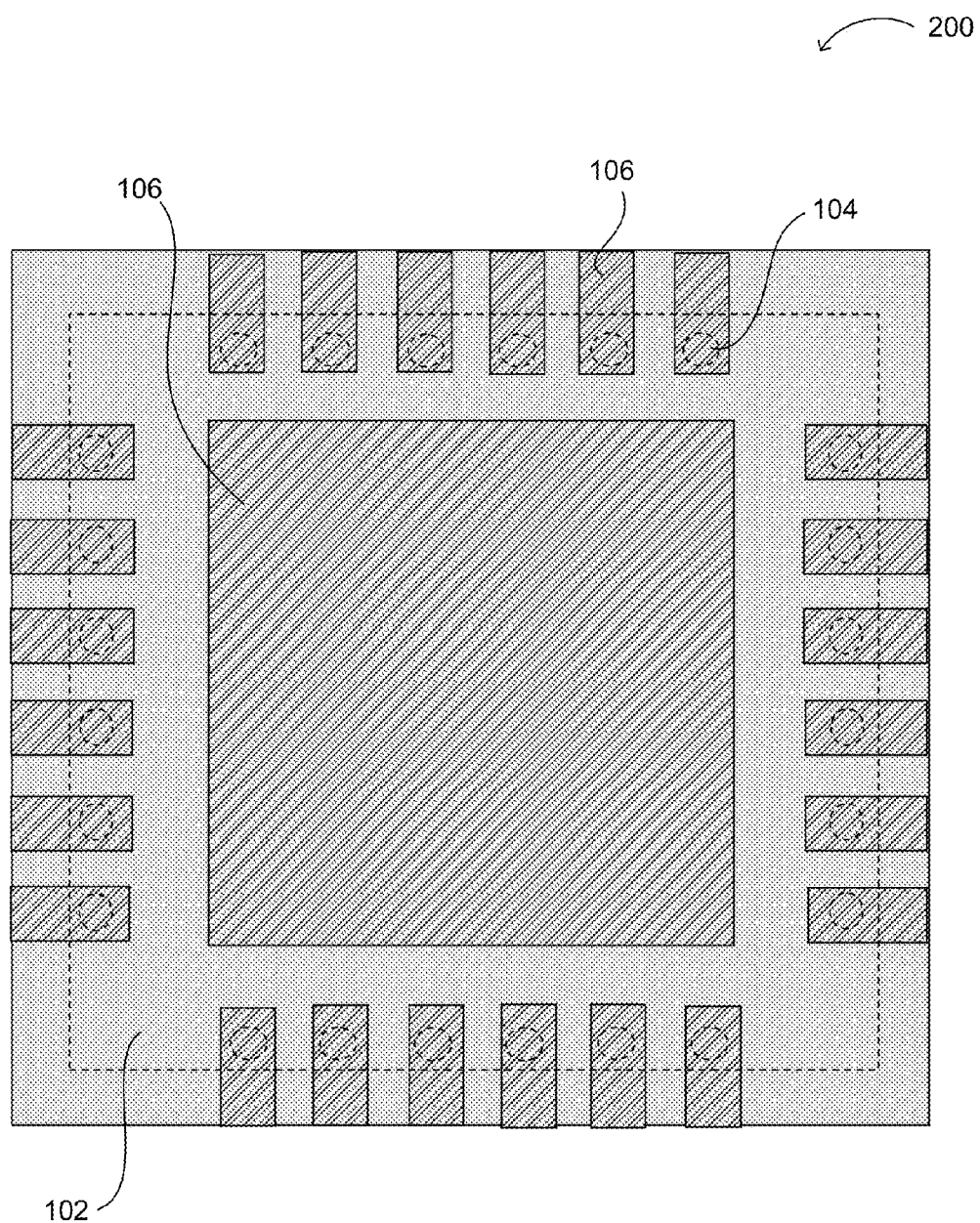
FIG. 2 is a top view diagram of an example quad flat no lead (QFN) lead frame.

Referring now to FIG. 2, shown is a top view diagram 200 of an example quad flat no lead (QFN) lead frame. The QFN package offers a variety of benefits, such as a reduced lead inductance, a small sized "near chip scale" footprint, a relatively thin profile, and relatively low weight. The QFN package also uses peripheral I/O pads to ease PCB trace routing, and exposed copper die-pad technology offers good thermal and electrical performance.

Figure 3A:
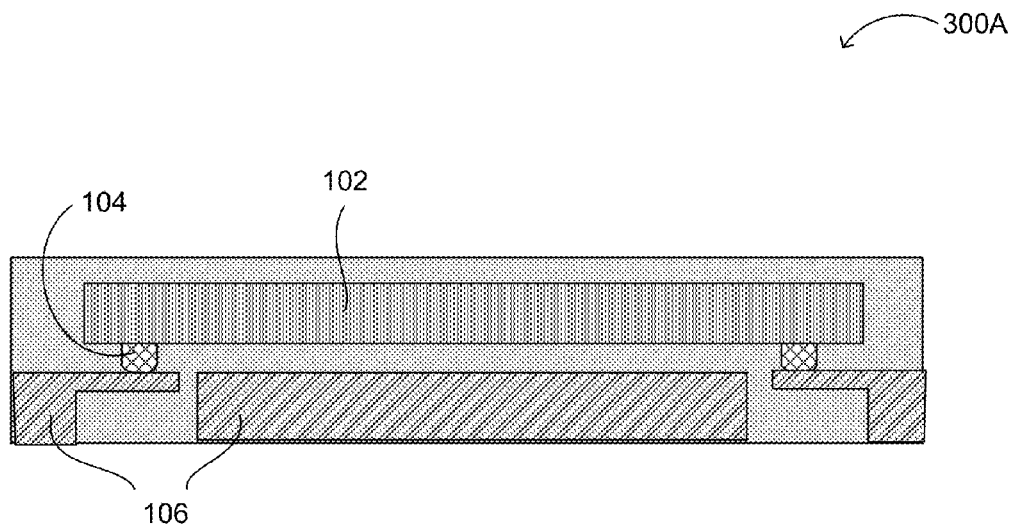
FIGS. 3A-3B are cross-section diagrams of an example flip-chip QFN package.
Figure 3B:
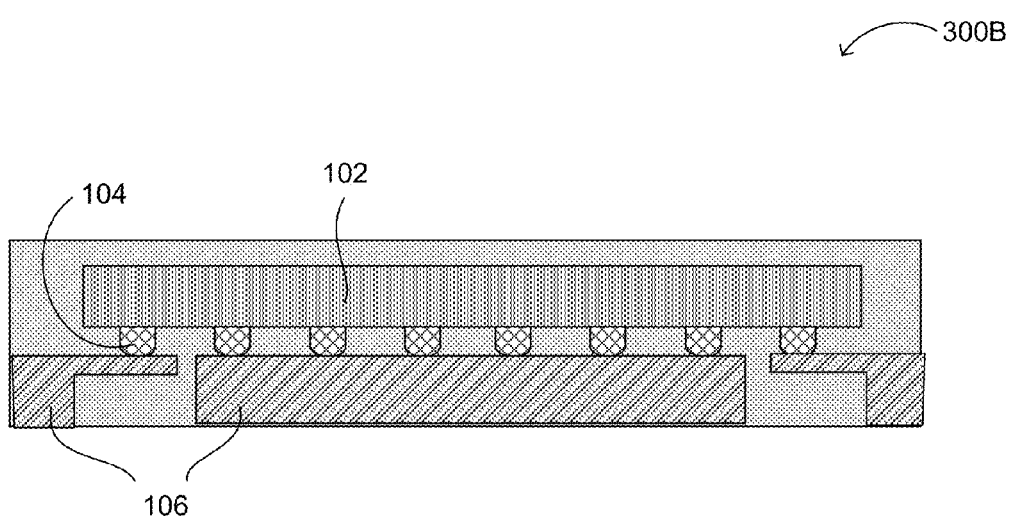

This example lead frame 106 includes a central rectangular die "paddle" and peripheral leads. The center die paddle here is used to provide mechanical support of silicon die 102, and there is no connection between the silicon die and the central die paddle. Some other approaches involve QFN packages that have a connection between the silicon die and the central die paddle, but strictly to provide either one additional I/O to the package, and/or to help dissipate heat. FIGS. 3A-3B show cross-section diagrams corresponding to the example of FIG. 2. In FIG. 3A (300A), there is no connection from die 102 to the center die paddle, but FIG. 3B (300B) shows multiple common connections between die 102 and the center die paddle.

In particular embodiments, no single piece or relatively large square of central die paddle on a QFN lead frame need be used, but rather interleaved lead fingers (e.g., arranged in rows or columns in a uniform matrix) are used. In this fashion, center leads may extend toward an edge of the lead frame, and peripheral leads may extend into the center region overlapping with the die. In addition, the lead frame can be etched to create different patterns on the lead frame surface attached to the silicon die (referred to herein as the "top" surface), and the lead-exposed surface die (referred to herein as the "bottom" surface), at which connection can be made with a system PCB board. The top and bottom surfaces of the lead frame can be optimized to provide efficient connections to both the silicon die and the system PCB board. Further, particular embodiments may utilise a single lead frame layer for conduction of current between the silicon and the system PCB.

Exemplary Monolithic Voltage Regulator Connection Apparatus

In one example, an apparatus can include: (i) a monolithic voltage regulator with a transistor arranged as parallel transistor devices; (ii) bumps on the monolithic voltage regulator to form or complete connections to source and drain terminals of the transistor; (iii) a single layer lead frame with a plurality of interleaving lead fingers coupled to the monolithic voltage regulator via the bumps, where the single layer lead frame includes first and second surfaces, where the first surface includes a first pattern to form connections to the bumps, and where the second surface includes a second pattern that is different from the first pattern; and (iv) a flip-chip package encapsulating the monolithic voltage regulator, the bumps, and the single layer lead frame, where the flip-chip package has external connectors of the monolithic voltage regulator at the second surface of the single layer lead frame.

Figure 4:
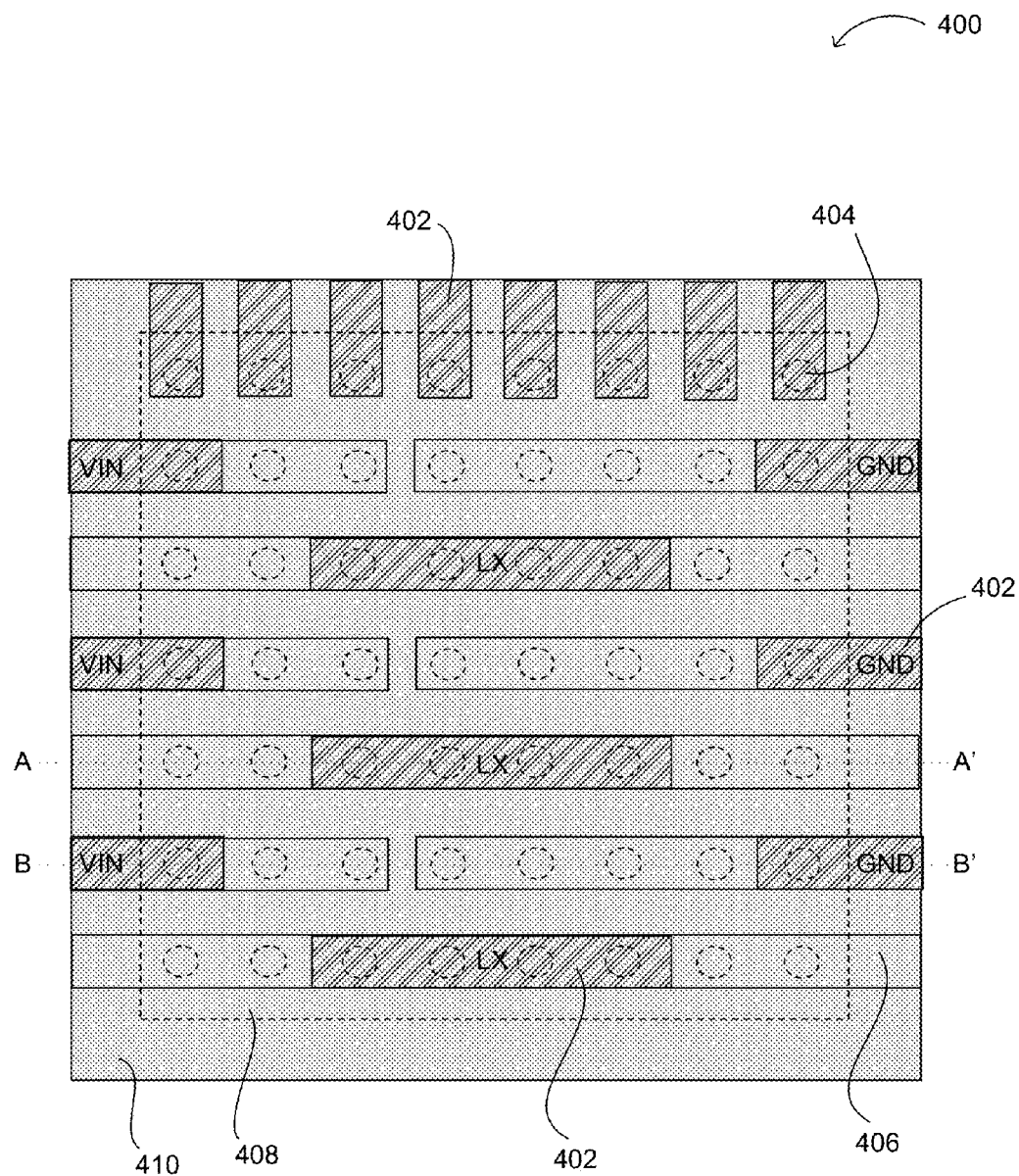
FIG. 4 is a lead frame diagram of an example QFN package with a center lead in accordance with embodiments of the present invention.

Referring now to FIG. 4, shown is a lead frame diagram 400 of an example QFN package with a center lead in accordance with embodiments of the present invention. In this particular QFN package 410, no relatively large single center lead or single piece of paddle is employed, but rather a plurality of interleaving leads are utilized. On a top surface connecting with silicon die 408, center and peripheral leads 402/406 are arranged in an interleaved fashion, and some leads or portions thereof, may also be exposed on a bottom surface for connecting to a system PCB. In FIG. 4, thicker lead finger portions 402 include exposed bottom surface connectors to accommodate system PCB connections. At this PCB level, parallel connections for various regulator terminals (see, e.g., FIG. 6 for VIN, LX, and GND terminals), can be formed.

Transistors on semiconductor (e.g., silicon) die 408 can include any suitable type of transistor, such as a lateral double-diffused metal oxide semiconductor (LDMOS) transistor. The lead frame materials can be any suitable material (e.g., Cu alloy, etc.). Also, package 410 can be a QFN, a dual flat no leads (DFN), or any other suitable package. Further, bumps or bumping balls 404 for connection between lead fingers 402/406 and die 408, can be formed using any suitable technology (e.g., Cu-pillar, solder, electroless nickel/immersion gold (ENIG), etc.).

Figure 5A:
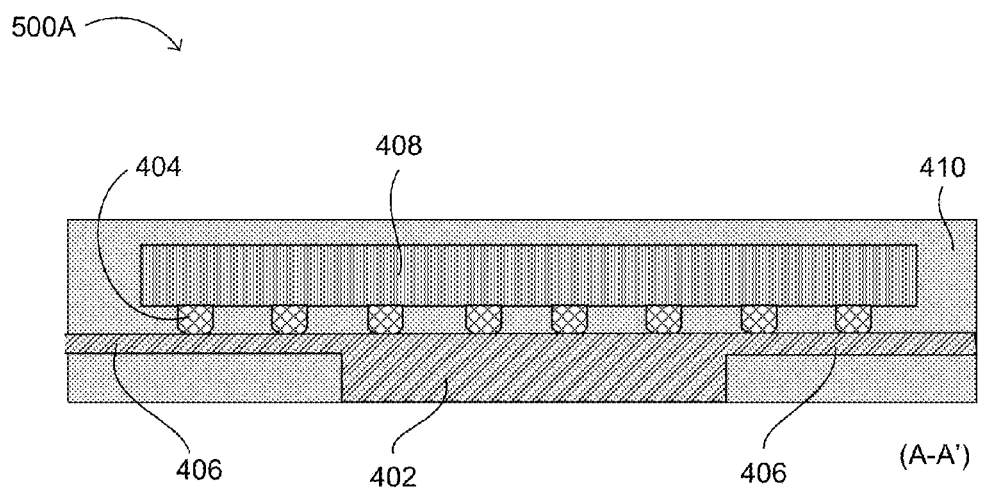
FIGS. 5A-5B are cross-section diagrams of an example flip-chip QFN package in accordance with embodiments of the present invention.
Figure 5B:
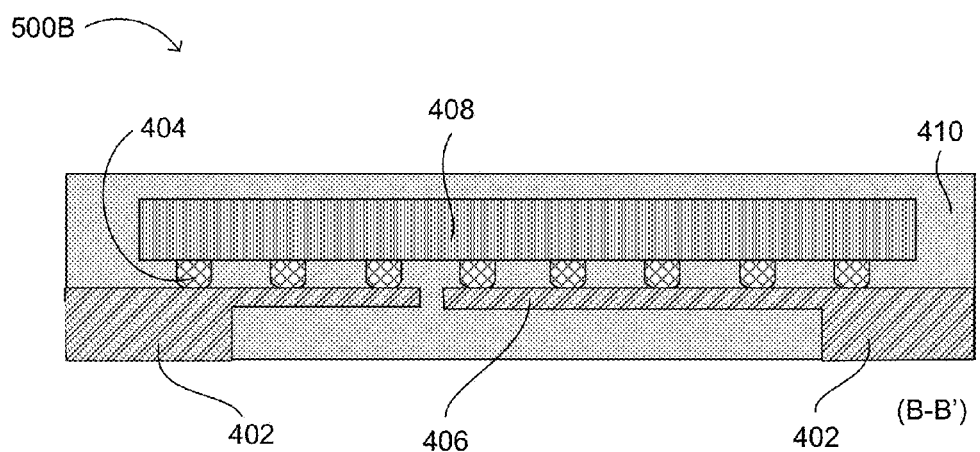

Referring now to FIGS. 5A-5B, shown are cross-section diagrams of the example flip-chip QFN package shown in FIG. 4, in accordance with embodiments of the present invention. In FIG. 5A (500A), a cross-section along line A-A' of FIG. 4 is shown. The lead frame can include a thicker portion (e.g., 402) and a thinner portion (e.g., 406) such that different surface patterns are seen at a top surface (at attachment to die 408 via balls 404) versus a bottom surface (lead-exposed surface for PCB connections). For example, thinner portion 406 of the lead frame can be formed through a stamping or etching process on a uniform thicker lead frame. Thus, the cross-section of FIG. 5A shows an exposed center lead or lead finger substantially overlapping with die 408. In FIG. 5B (500B), a cross-section along line B-B' of FIG. 4 is shown. Here, a peripheral lead structure is shown, where the lead-exposed surfaces at a bottom surface for lead frame portions 402 are at the periphery of package 410.

In this fashion, a single layer lead frame with two different surface patterns at a top surface versus a bottom surface, can be accommodated in particular embodiments. For example, a top lead frame surface can be optimized for connection via bumps 404 to a monolithic voltage regulator in semiconductor die 408, while a bottom lead frame surface (e.g., by way of thicker lead frame portions 402) can be optimized for a system (e.g., PCB) connection. For example, a thickness of lead frame portion 402 can range from about 0.1 mm to about 0.2 mm (e.g., about 0.15 mm), and a thickness of lead frame portion 406 can range from about 0.05 mm to about 0.1 mm (e.g., about 0.075 mm). Thus, lead frames in particular embodiments may be independent of a substrate, a via therein, or other PCB layers for forming connections between a semiconductor die and a system PCB.

Figure 6:
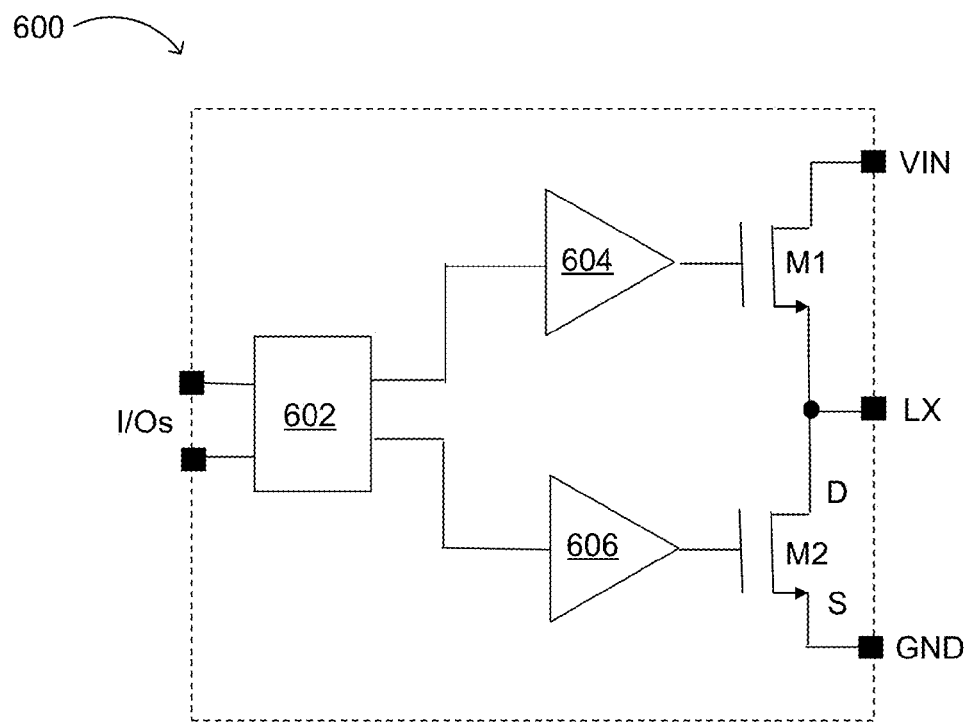
FIG. 6 is a schematic block diagram of an example monolithic buck switching regulator, suitable for use in accordance with embodiments of the present invention.

Referring now to FIG. 6, shown is a schematic block diagram 600 of an example monolithic buck switching regulator, suitable for use in accordance with embodiments of the present invention. This particular example shows a simplified monolithic DC to DC buck switching regulator, while a more detailed example regulator is discussed below with reference to FIG. 9. In FIG. 6, controller 602 can receive and supply analog and/or digital I/Os, and can control high-side driver 604 and low-side driver 606. High-side power transistor M1 can connect to input supply VIN and switching node LX, while low-side power transistor M2 can connect to LX and GND, as shown. Integration of such components into a same piece of silicon may involve the use of lateral power transistor devices, as discussed further below with reference to FIG. 9. Also, all I/O pins may be arranged on a same side of the semiconductor die.

Figure 7A:
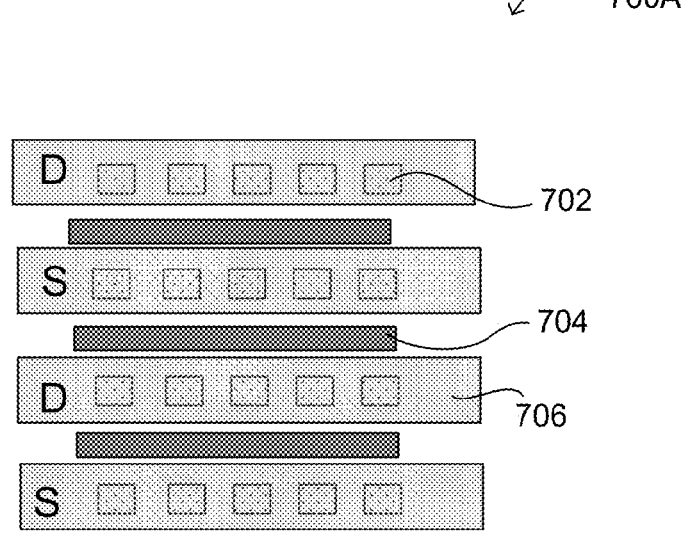
FIGS. 7A-7C are layout diagrams showing example power conduction paths, suitable for use in accordance with embodiments of the present invention.
Figure 7B:
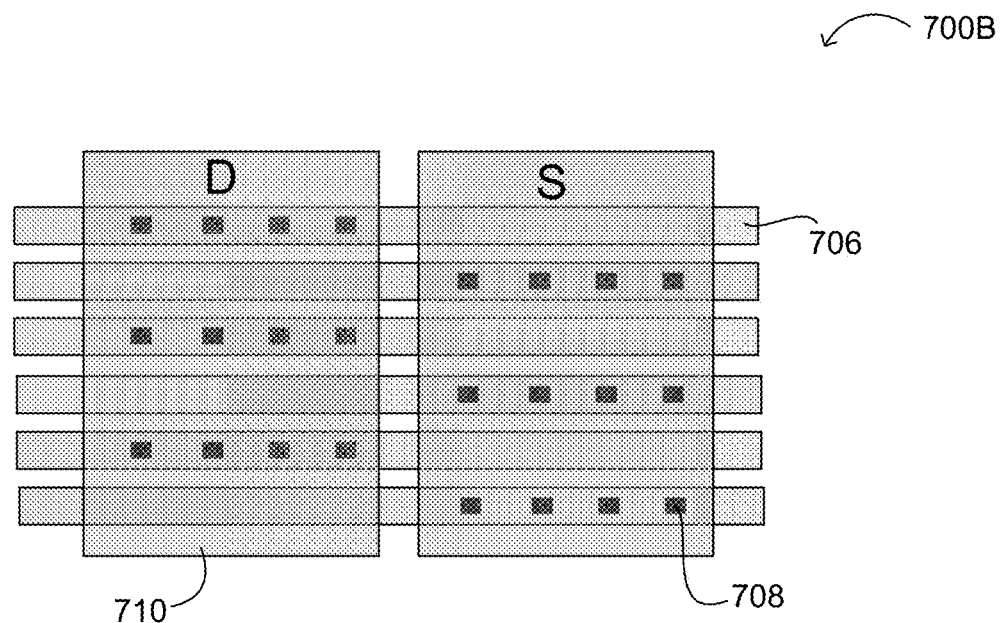
Figure 7C:
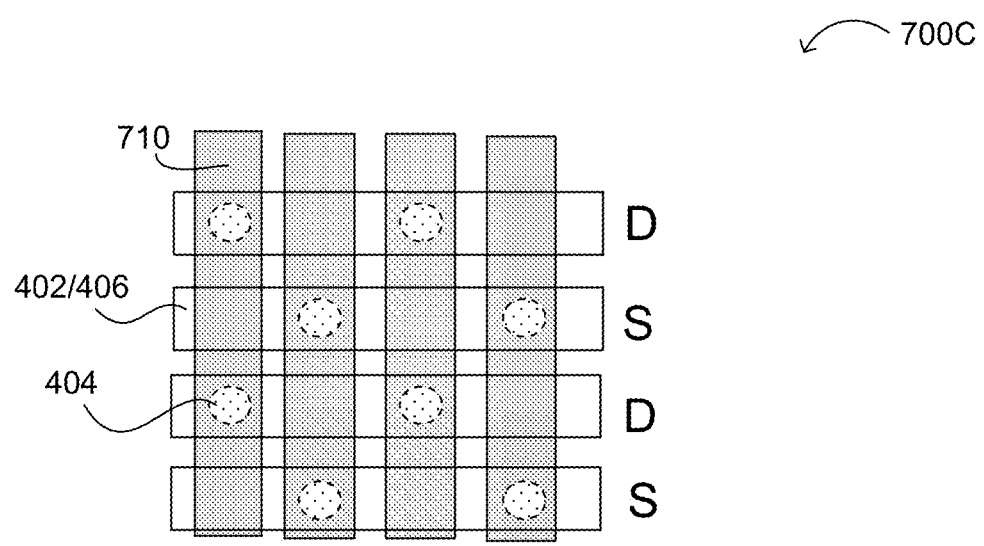

Among the external connections for a monolithic regulator, the highest currents are carried through "power pins" VIN, GND, and LX. Referring now to FIGS. 7A-7C, shown are example power conduction paths, suitable for use in accordance with embodiments of the present invention. These diagrams show a current conducting path of one or a portion of a power transistor at varied metallization levels. A flip-chip QFN package in particular embodiments can provide increased conduction path efficiencies at all levels of metallization, as compared to conventional packaging approaches.

The power transistors can include, e.g., tens of thousands of smaller unit cells, which are then connected in parallel by higher levels of metallization. In FIG. 7A (700A), shown is a cell-level transistor structure, whereby a first metal (metal-1) 706 is used to contact 702 source and drain regions of the transistors formed with polysilicon gates 704. For example, a pitch between metal-1 layers can be less than about 5 μm. In FIG. 7B (700B), a second metal (metal-2) 710 is used to connect (using vias 708) source and drain nodes in a parallel fashion. For example, a pitch between these metal-2 layers may be less than about 50 μm. Current thus flows through multiple layers of metallization, including a more resistive thin bottom metal (metal-1), and a less resistive top metal (metal-2). In addition, higher levels of metallization (e.g., metal-3, metal-4, etc.), or other connective material, may also be used in particular embodiments.

In FIG. 7C (700C), lead frame 402/406 can connect via bumps 404 to metal-2 source and drain terminals. For example, the lead frame fingers 402/406 may have a pitch of less than about 500 μm, and system PCB traces can be even larger. In this fashion, particular embodiments can include lead frames and packaging to provide connections to a monolithic regulator such that conduction paths are minimized at multiple levels of metallization.

Figure 8A:
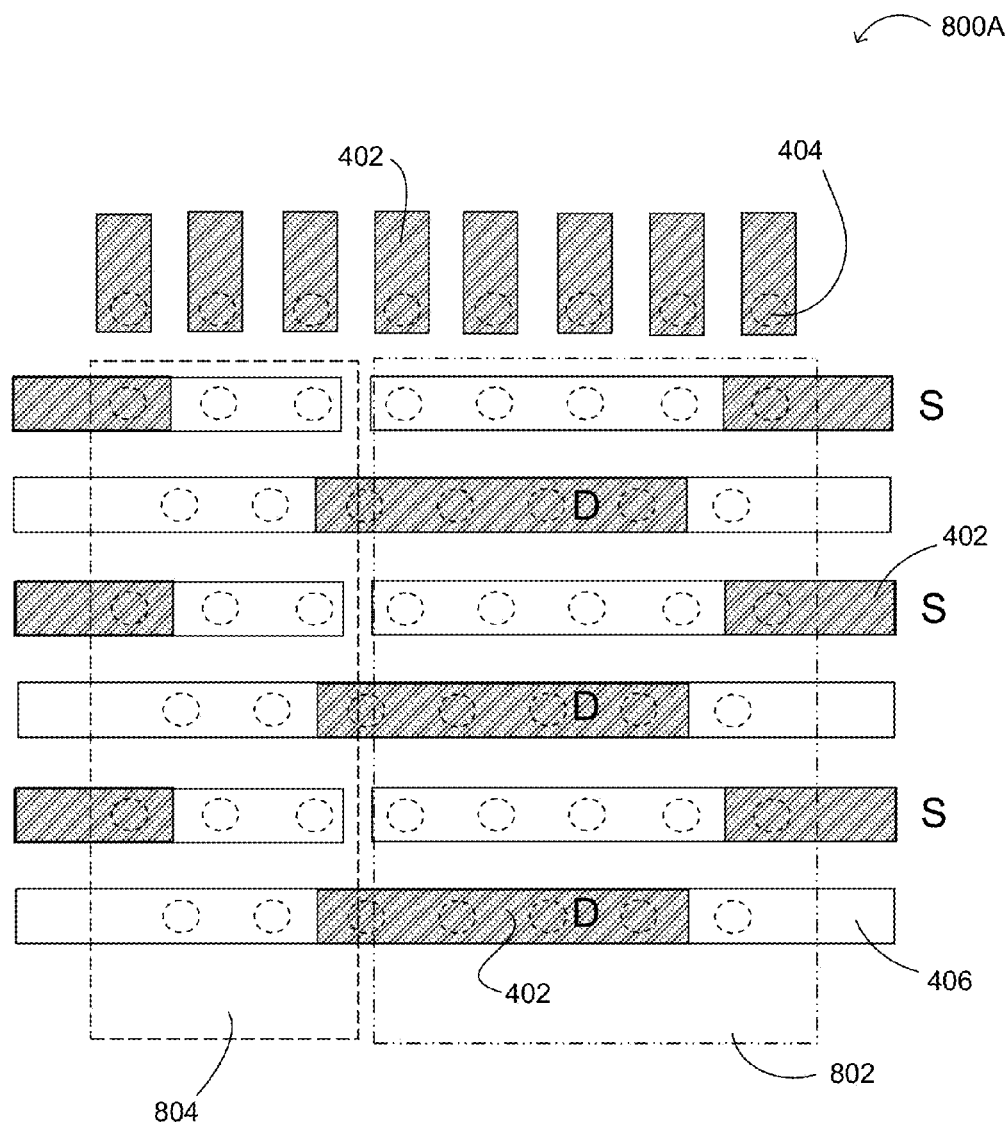
FIG. 8A is a layout diagram showing a first example of top and bottom lead frame surfaces in accordance with embodiments of the present invention.

Referring now to FIG. 8A, shown is a layout diagram 800A of a first example of top and bottom lead frame surfaces in accordance with embodiments of the present invention. In this example, a low-side transistor (e.g., transistor M2 of FIG. 6) can be formed in region 802, while a high-side transistor (e.g., transistor M1 of FIG. 6) can be formed in region 804. Other transistor and lead frame or lead finger arrangements can also be used in particular embodiments.

Figure 8B:
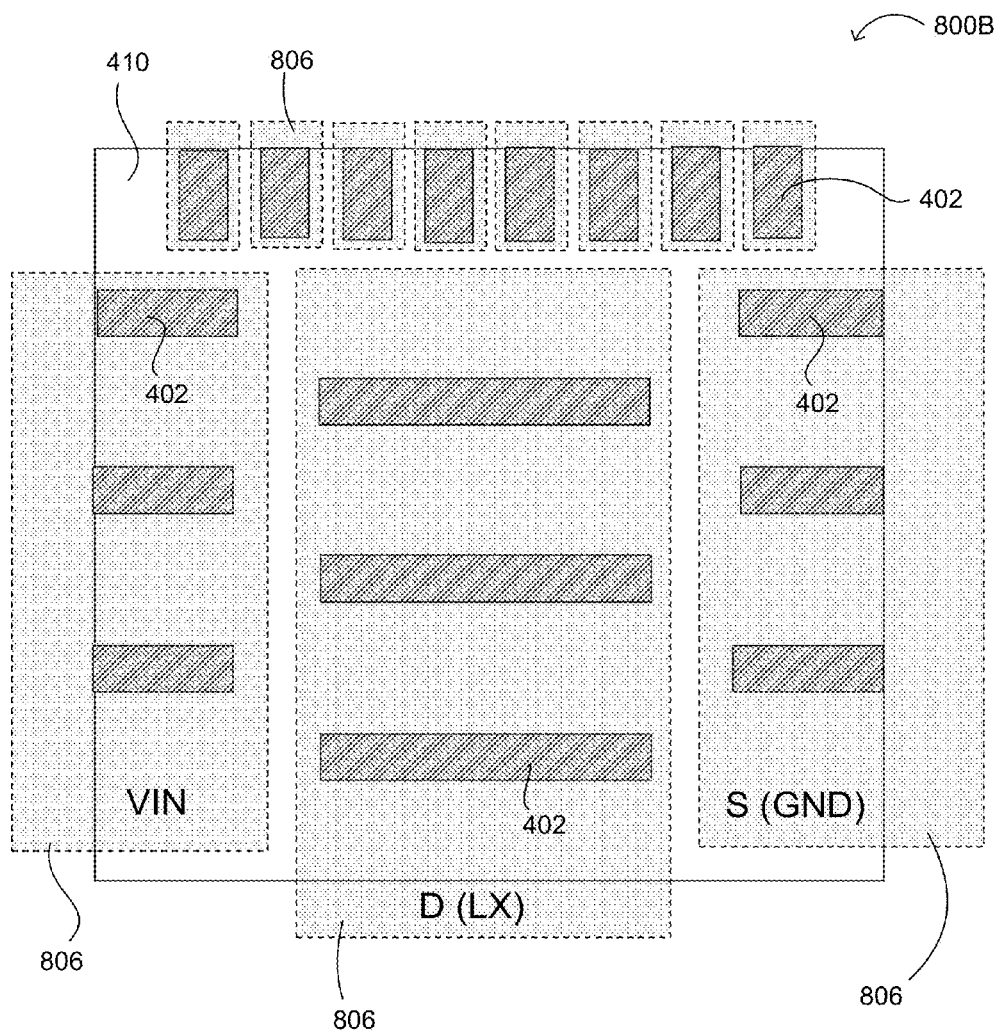
FIG. 8B is a layout diagram showing an example bottom lead frame surface and printed-circuit board (PCB) level in accordance with embodiments of the present invention.

Referring now to FIG. 8B, shown is a layout diagram 800B of an example bottom lead frame surface and PCB-level, in accordance with embodiments of the present invention. This example shows exposed bottom surface lead portions 402 connected at a PCB level via PCB metallization (e.g., Cu) 806. For example, external regulator connections VIN, LX, and GND, can be formed as shown. In addition, a footprint of package 410 is scalable in that the power transistor regions can be extended or reduced by adjusting the area of the power transistors, thus facilitating design of a family of products tailored for applications with different current ratings.

Figure 8C:
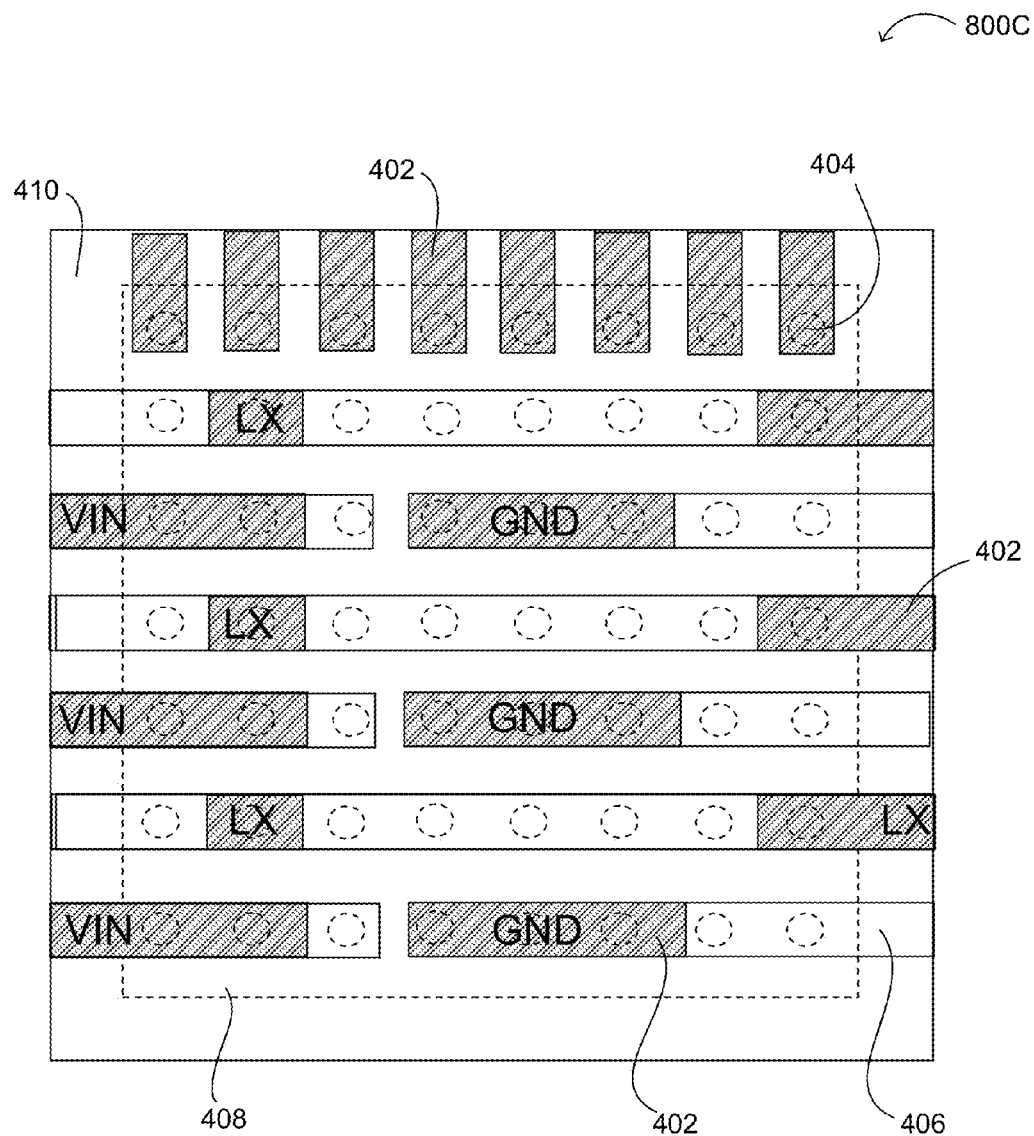
FIGS. 8C-8D are layout diagrams showing second and third examples of top and bottom lead frame surfaces in accordance with embodiments of the present invention.
Figure 8D:
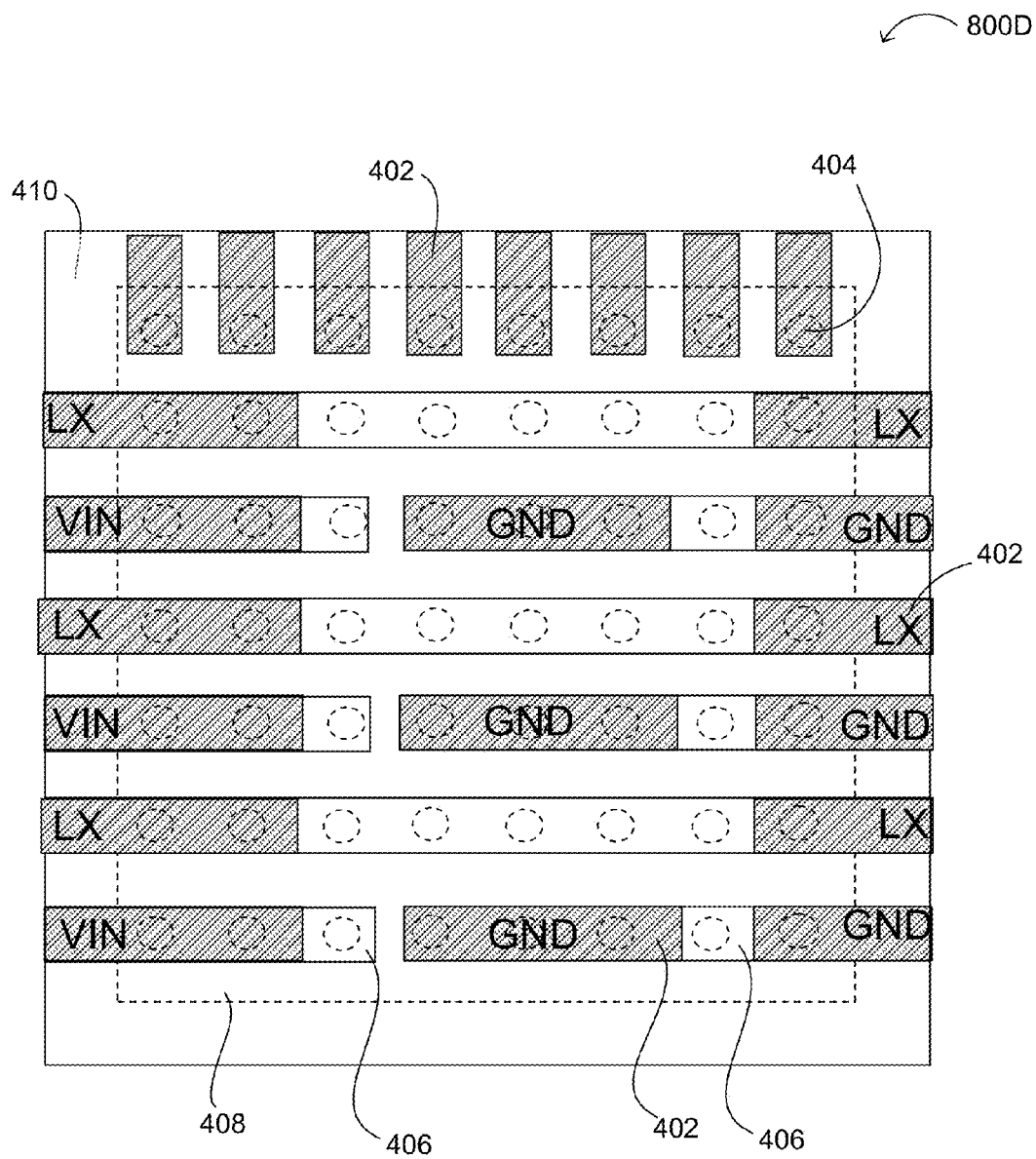

Referring now to FIGS. 8C and 8D, shown are layout diagrams 800C of a second example and 800D of a third example, of top and bottom lead frame surfaces in accordance with embodiments of the present invention. These examples show an alternate arrangement for terminals VIN, LX, and GND. In these two particular examples, the exposed bottom surface (thicker portion of the lead frame) are arranged to provide improved mechanic support for the thinner portion of the lead frame. In fact, any suitable arrangement for the interleaving lead frame fingers and the like can be used, based on the particular circuit layout on the semiconductor die, and associated PCB routing.

Exemplary LDMOS Transistor Structures and Applications

Figure 9:
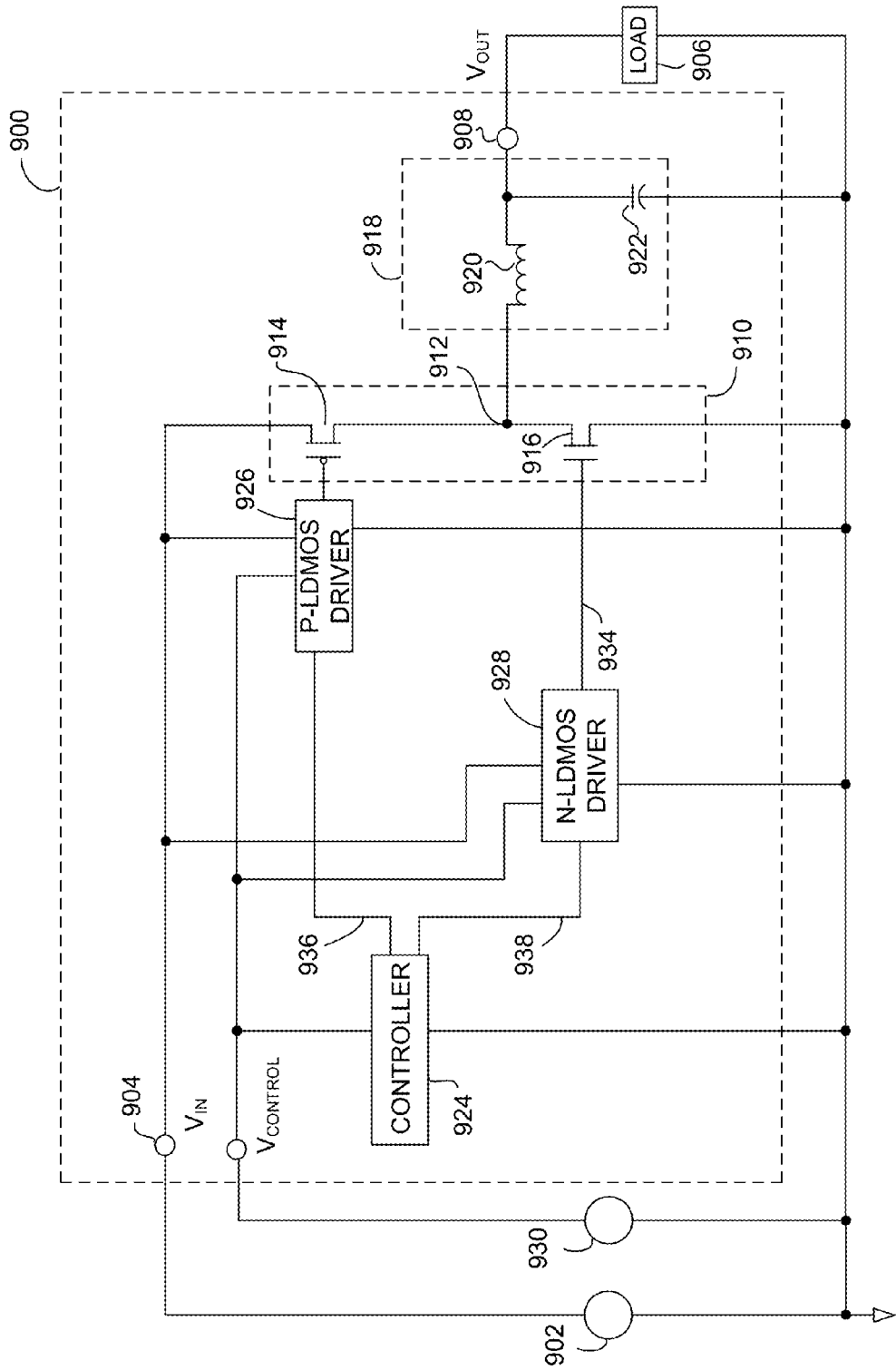
FIG. 9 is a block schematic diagram of an example switching voltage regulator using lateral double-diffused metal oxide semiconductor (LDMOS) transistors, suitable for use in accordance with embodiments of the present invention.

Referring now to FIG. 9, shown is a block schematic diagram 900 of an example switching voltage regulator using LDMOS transistors, suitable for use in accordance with embodiments of the present invention. In this example, P-LDMOS transistor 914 can correspond to high-side transistor M1, N-LDMOS transistor 916 can correspond to low-side transistor M2, and intermediate terminal 912 can correspond to switching node LX, as discussed above.

Exemplary monolithic switching regulator 900 may be coupled to a first high DC input voltage source 902 (e.g., a battery) by an input terminal 904. The switching regulator 900 may also be coupled to a load 906 (e.g., an IC) by an output terminal 908. The switching regulator 900 thus serves as a DC-to-DC converter between the input terminal 904 and the output terminal 908.

The switching regulator 900 can include a switching circuit 910 that serves as a power switch for alternately coupling and decoupling the input terminal 904 to an intermediate terminal 912. Switching circuit 910 may also include a rectifier, such as a switch or diode, coupling the intermediate terminal 912 to ground. For example, switching circuit 910 may include a first transistor 914 having a source connected to the input terminal 904, and a drain connected to the intermediate terminal 912, and a second transistor 916 having a source connected to ground and a drain connected to the intermediate terminal 912. Transistor 914 may be a p-type LDMOS (P-LDMOS) transistor, whereas transistor 916 may be an n-type LDMOS (N-LDMOS) transistor.

The intermediate terminal 912 may be coupled to the output terminal 908 by an output filter 918. The output filter 918 converts the rectangular waveform of the intermediate voltage at the intermediate terminal 912 into a substantially DC output voltage at the output terminal 908. In an example buck-converter topology, output filter 918 includes an inductor 920 connected between intermediate terminal 912 and the output terminal 908, and a capacitor 922 connected in parallel with the load 906. During a P-LDMOS conduction period, the first transistor is closed, and the voltage source 902 supplies energy to the load 906 and the inductor 920 through the first transistor 914. However, during an LDMOS transistor conduction period, the second transistor 916 is closed, and current flows through the second transistor 916 as energy is supplied by the inductor 920. The resulting output voltage $V_{out}$ may thus be a substantially DC voltage.

The switching regulator may also include a controller 924, a P-LDMOS driver 926, and an N-LDMOS driver 928 for controlling the operation of the switching circuit 700. The P-LDMOS driver 926 and the N-LDMOS driver are coupled to voltage source 930. A first control line 932 can connect the P-LDMOS transistor 914 to its driver 926, and a second control line 934 can connect the N-LDMOS transistor 916 to its driver 928. The two drivers may be connected to the controller 924 by control lines 936 and 938, as shown. The controller 924 causes the switching circuit 900 to alternate between P-LDMOS and N-LDMOS conduction periods so as to generate an intermediate voltage $V_{int}$ at intermediate terminal 912 that has a rectangular waveform. Controller 924 can also include a feedback circuit for measuring the output voltage and the current passing through the output terminal.

Although the controller 924 is typically a pulse width modulator, particular embodiments are also applicable to other modulation schemes, such as pulse frequency modulation. Further, while the switching regulator discussed above has a buck converter topology, particular embodiments are also applicable to other voltage regulator topologies, such as a boost converter or a buck-boost converter, and to radio frequency (RF) output amplifiers.

In another application example, an N-LDMOS, which is also known as high-side switch, can be used to replace P-LDMOS transistor 914. In this example configuration, the n-type high-side switch may have its drain connected to input terminal 904, and its source connected to intermediate terminal 912. The P-LDMOS driver 926 may also be replaced with a high-side N-LDMOS driver in this particular example.

Exemplary Method of Connecting to a Monolithic Voltage Regulator

In one example, a method of connecting to a monolithic voltage regulator, can include: (i) using bumps on the monolithic voltage regulator to form or complete connections to source and drain terminals of a transistor of the monolithic voltage regulator; (ii) using a first surface of a single layer lead frame to connect to the monolithic voltage regulator via the bumps and interleaving lead fingers on the lead frame, where the first surface has a first pattern, and where the single layer lead frame includes the first surface and a second surface; (iii) using a flip-chip package to encapsulate the monolithic voltage regulator, the bumps, and the single layer lead frame; and (iv) using the second surface of the single layer lead frame to provide external connections to the monolithic voltage regulator at the flip-chip package, where the second surface includes a second pattern that is different from the first pattern.

Figure 10:
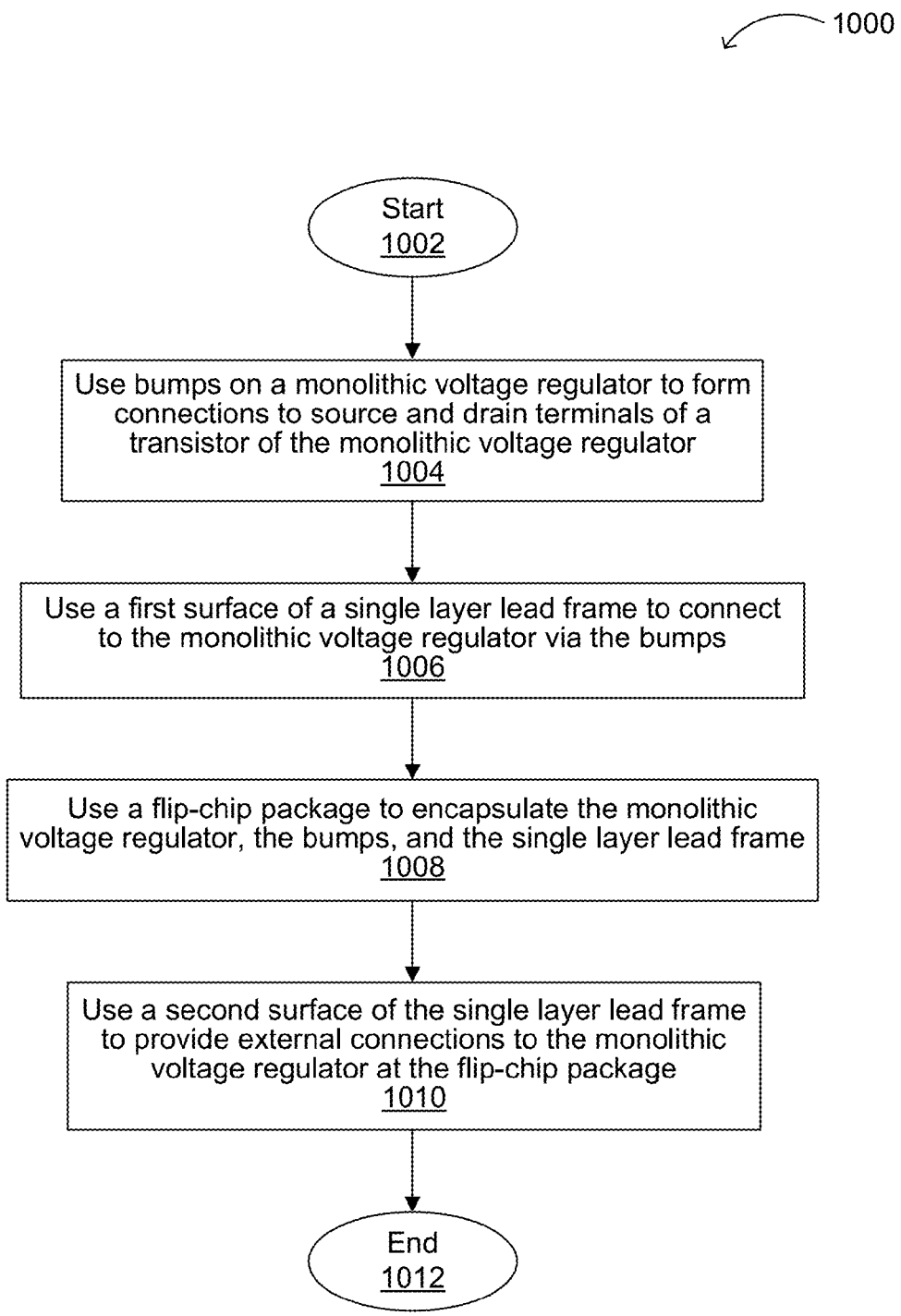
FIG. 10 is a flow diagram of an example method of connecting to a monolithic voltage regulator in accordance with embodiments of the present invention.

Referring now to FIG. 10, shown is a flow diagram 1000 of an example method of connecting to a monolithic voltage regulator in accordance with embodiments of the present invention. The flow can begin (1002), and bumps on a monolithic voltage regulator can be used to form connections to source and drain terminals of a transistor of the monolithic voltage regulator (1004). A first or top surface of a single layer lead frame can be used to connect to the monolithic voltage regulator via the bumps (1006). For example, the single layer lead frame can employ interleaving lead fingers, and lead frame patterns can differ between the top and bottom surfaces of the lead frame.

A flip-chip package (e.g., QFN, DFN, etc.) can be used to encapsulate the monolithic voltage regulator, the bumps, and the single layer lead frame (1008). The second or bottom surface of the single layer lead frame can be used to provide external connections to the monolithic voltage regulator at the flip-chip package (1010), completing the flow (1012). As discussed above, the second or bottom lead frame surface can include a second pattern that is different from the first pattern seen at the top lead frame surface. Also, the external connections can be utilized by a PCB for a system or other level connection. Finally, any methods in particular embodiments are not limited to any example order of steps, such as that shown in FIG. 10, but rather the order can be varied.

While the above examples include arrangement and structural implementations of monolithic regulator packages and lead frames, one skilled in the art will recognize that other technologies and/or structures can be used in accordance with embodiments. For example, spacing between lead fingers and metallization layers can be changed in particular embodiments. Further, one skilled in the art will recognize that other device cross-section arrangements, other lead frame designs and patterns, other monolithic regulator designs (e.g., current regulators), other types and numbers of regulator terminals, such as for external connections, etc., and other types of packages and the like may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of connecting to a monolithic voltage regulator, the method comprising:
   a) using a plurality of bumps on said monolithic voltage regulator to form connections to source and drain terminals of a transistor of said monolithic voltage regulator;
   b) using a first surface of a single layer lead frame to connect to said monolithic voltage regulator via said plurality of bumps, said first surface having a first pattern, said single layer lead frame comprising said first surface and a second surface, said single layer lead frame having a plurality of interleaving lead fingers for connecting to said plurality of bumps, wherein each said interleaving lead finger comprises a first portion with a first thickness and a second portion with a second thickness, wherein said first thickness is greater than said second thickness, and wherein at least one of said interleaving lead fingers comprises two first portions separated by one second portion;
   c) using a flip-chip package to encapsulate said monolithic voltage regulator, said plurality of bumps, and said single layer lead frame; and
   d) using said second surface of said single layer lead frame to provide external connectors to said monolithic voltage regulator at said flip-chip package, wherein said second surface comprises a second pattern that is different from said first pattern.

2. The method of claim 1, wherein said plurality of interleaving lead fingers are arranged to overlap with an active area of said monolithic voltage regulator.

3. The method of claim 1, wherein said monolithic voltage regulator comprises a switching regulator.

4. The method of claim 3, wherein said switching regulator comprises a buck-type switching regulator.

5. The method of claim 1, further comprising using a printed-circuit board (PCB) to connect to said external connectors at said second surface.

6. The method of claim 1, wherein said plurality of bumps are formed using a Cu-pillar bump process.

7. The method of claim 1, wherein said plurality of bumps are formed using a solder bump process.

8. The method of claim 1, wherein said plurality of bumps are formed using an electroless nickel/immersion gold (ENIG) bump process.

9. The method of claim 1, wherein said transistor comprises a lateral double-diffused metal oxide semiconductor (LDMOS) transistor.

10. The method of claim 1, wherein said flip-chip package comprises a quad flat no leads (QFN) package.

11. The method of claim 1, wherein said flip-chip package comprises a dual flat no leads (DFN) package.

12. The method of claim 1, wherein said plurality of bumps are arranged in a uniform matrix.

13. The method of claim 1, wherein said single layer lead frame is independent of a substrate.

14. The method of claim 1, wherein said single layer lead frame is independent of a via.

15. The method of claim 1, wherein said first and second portions of each said interleaving lead finger form different patterns for said first and second surfaces.

16. The method of claim 1, wherein said second surface is exposed at said single layer lead frame for said external connectors.

17. The method of claim 1, wherein said first thickness is in a range of from about 0.1 mm to about 0.2 mm, and said second thickness is in a range of from about 0.05 mm to about 0.1 mm.

18. The method of claim 1, wherein each of said interleaving lead fingers that is designated for a ground node comprises a first portion that substantially overlaps with said monolithic voltage regulator.

19. The method of claim 1, wherein each of said interleaving lead fingers that is designated for a supply node comprises a first portion that is substantially at a periphery of said flip-chip package.

* * * * *